United States Patent [19]
Henkels et al.

[11] Patent Number: 5,939,898
[45] Date of Patent: Aug. 17, 1999

[54] INPUT ISOLATION FOR SELF-RESETTING CMOS MACROS

[75] Inventors: Walter Harvey Henkels, deceased, late of Putnam Valley, by Lois E. Henkels, legal representative; Wei Hwang, Armonk; Rajiv Vasant Joshi, Yorktown Heights, all of N.Y.

[73] Assignee: International Business Machines Corporation, Armonk, N.Y.

[21] Appl. No.: 08/881,265

[22] Filed: Jun. 24, 1997

[51] Int. Cl.⁶ ........................ H03K 19/00; H03K 19/096
[52] U.S. Cl. ................................. 326/93; 326/98
[58] Field of Search .................. 326/93, 98, 95

[56] References Cited

U.S. PATENT DOCUMENTS

| | | | |
|---|---|---|---|
| 5,550,490 | 8/1996 | Durham et al. | 326/98 |
| 5,565,798 | 10/1996 | Durham et al. | 326/93 |
| 5,652,530 | 7/1997 | Ashuri | 326/93 |
| 5,698,996 | 12/1997 | Ko | 326/93 |
| 5,767,715 | 6/1998 | Marquis et al. | 327/159 |
| 5,859,547 | 1/1999 | Tran et al. | 326/98 |

*Primary Examiner*—Jon Santamauro
*Assistant Examiner*—Richard Roseen
*Attorney, Agent, or Firm*—Whitham, Curtis & Whitham; Paul J. Otterstedt

[57] ABSTRACT

Very fast very large scale integrated (VLSI) chips can be built-up from "self-resetting" or "self-timed" macros. An input isolator circuit provides an effective input isolation/decoupling which allows the input pulse widths to vary over a wide range. This avoids, for a large chip having many macros, a significant problem in insuring that the output from one macro is compliant with the input requirements of a receiving macro. Mixed static and dynamic circuits are used. The circuit comprises three stages. The input first stage is a static NOR circuit providing a pulse-chopping function. This first stage chops any too wide input pulse to the desired pulse width. The middle stage is a self-resetting complementary metal oxide semiconductor (SRCMOS) dynamic NOR circuit to capture input which is reset too soon. The last stage is a half-latch circuit to keep the dynamic node at constant output voltage level. The interfaces of all self-resetting macros in accordance with the teachings of the invention have no need for a handshake circuit or interlock circuits.

19 Claims, 8 Drawing Sheets

COLLISION ON NODE-B:
QF AND QR BOTH CONDUCTING

INPUT ISOLATION FOR SELF-RESETTING CMOS MACROS

BACKGROUND OF THE INVENTION

FIELD OF THE INVENTION

The present invention generally relates to digital data processing circuits and, more particularly, to sequential logic circuits and macros such as register file and macros used in the data paths and control paths of microprocessors. The invention is specifically directed to improved dynamic logic circuits and circuit techniques for achieving high-performance microprocessors with high data rates.

BACKGROUND DESCRIPTION

Digital system chips using pipelined operation can be partitioned and built-up from either static or dynamic circuits. The dynamic circuits generally occupy less area, primarily due to the fact that there are fewer p-channel metal oxide semiconductor (PMOS) devices. Furthermore, the dynamic circuits are generally faster than static circuits, because there are fewer PMOS devices loading the dynamic outputs. Less gate capacitance loading, again due to fewer PMOS load devices, also leads to lower power dissipation for the dynamic circuits. In short, dynamic circuits are faster and smaller than static circuits, and for a given cycle time dissipate less power.

As performance requirements have increased, high performance microprocessor chips have increased their use of dynamic approaches in design. Dynamic logic can be classified into synchronous or asynchronous two systems. See N. Weste and K. Eshraghian, *Principles of CMOS VLSI Design: A Systems Perspective*, 2nd edition, Addison-Wesley (1993), and J. P. Uyemura, *Circuit Design for CMOS VLSI*, Kluwer Academic Publishers (1992).

Figure 1A:
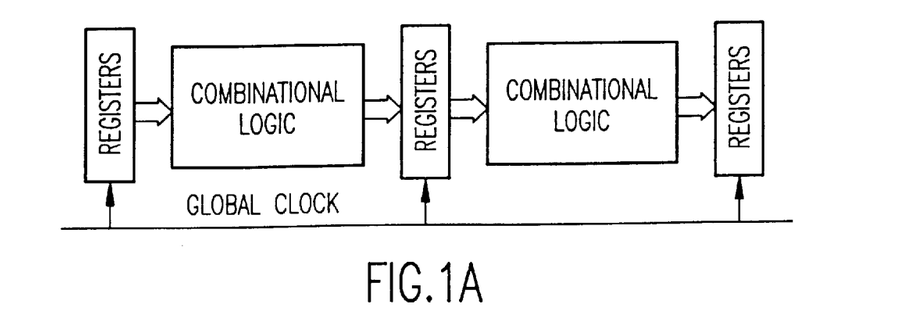
FIGS. 1A, 1B and 1C are block diagrams of dynamic logic circuits, respectively classified into three categories: (a) synchronous logic, (b) ssynchronous with handshaking, and (c) asynchronous without feedback between macros.
Figure 1B:
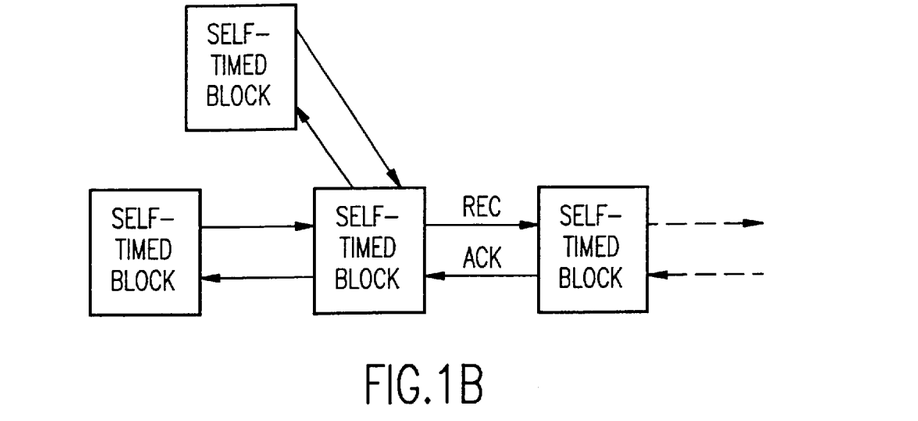
Figure 1C:
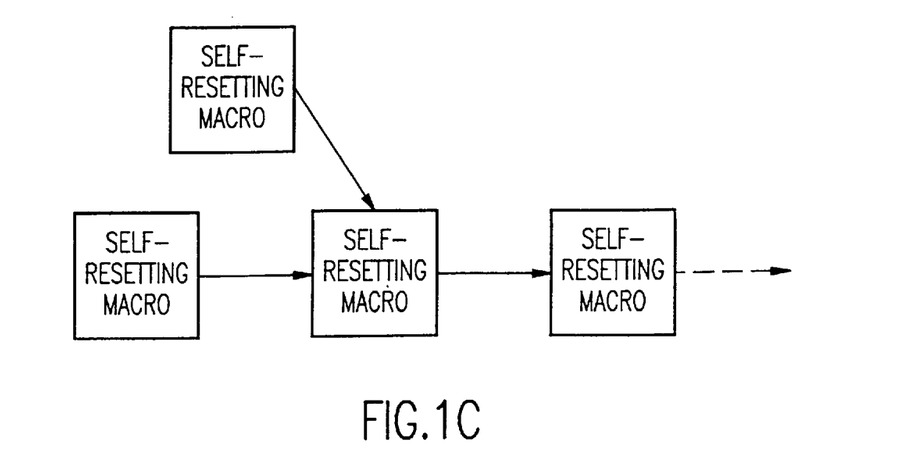

Systems such as shown in FIG. 1A, which are synchronized to a global clock are called synchronous. Conversely, asynchronous systems, such as shown in FIGS. 1B and 1C, have no global clock distribution, but instead require self-timed or self-resetting circuit techniques, which render them more difficult to design on a large scale; however, this is an area of current research. See, for example, I. Sutherland, "Micropipelines", *Communication of the ACM*, Vol. 32, pp. 720–738,1989. November 1991, and T. I. Chappell et al, "A 2-ns cycle, 3.8 ns access 512-Kb CMOS ECL SRAM with a fully pipelined architecture", *IEEE J. Solid-State Circuits*, vol. 26, no. 11, pp. 1577–1585, November 1991.

Synchronous systems require synchronization of the setting of latches to the global clock. The information stored in latches and registers can be updated (a new state replacing a present state) in a controlled and predictable manner by triggering from a periodic global clock signal distributed throughout the digital stages. The global clock ensures that all memory elements change state at approximately the same time. Asynchronous systems such as shown in FIGS. 1B and 1C, which have no global clock distribution, rely on either self-timed circuit techniques or self-resetting circuit techniques.

Referring to FIG. 1B, the self-timed asynchronous with "handshaking" systems are designed by making the precharge of the stages independent. A self-timed stage differs from a simple synchronous or domino stage since it can keep multiple tokens of data traveling separately. The simple control logic needs to check: (i) a stage or macro only precharge when all users of its data have finished evaluating and (ii) a stage only evaluates when all its successors are precharging (so that a token of data does not run into the one ahead). Therefore, there are needed "handshaking" signals between two adjacent stages or macros in the self-timed asynchronous systems. The handshaking signals are represented the receiving (REC) and acknowledge (ACK) two signals as shown in FIG. 1B.

Referring to FIG. 1C, the self-resetting asynchronous systems without feedback between two macros which are designed totally independent of any system clock. The self-resetting case differs significantly from the synchronous domino case and asynchronous self-timed cases. In self-resetting techniques, the reset is derived locally either by feedback from downstream evaluation logic, or from a local timing chain triggered by an upstream. When cycle time is too long, the reset circuits can be broken up into more self-resetting "pipe macros, with overlapping reset. Self-resetting macros are disclosed, for example, in U.S. Pat. No. 5,481,495 to W. Henkels, W. Hwang and T. I. Chappell for "Cells and Read-Circuits for High Performance Register Files", and U.S. Pat. No. 5,617,047 to W. Henkels, W. Hwang and R. V. Joshi for "Reset- and Pulse-width-control Circuits for High Performance Multiport Register Files".

All the self-resetting macros as shown in FIG. 1C are self-contained. Each macro consists of own evaluation path and reset chain. Each macro performs locally and asynchronously to the global system clock. Comparing the self-resetting case to other cases, self-resetting macros have the potential advantages over synchronous domino-logic of higher performance because of the absence of any clocking precharge devices in the logic trees and greatly reduces the loading on clock distribution of the system clock, thereby alleviating clock skew and power problems. Furthermore, the self-resetting macros have the potential advantages over the self-timed cases of simplification because of no handshake circuit requirement, and greatly improves the time constraints of each macro, thereby alleviating switching di/dt and power dissipation problems. The self-resetting case is difficult to design at the system level because of the lack of the global synchronization provided by a global clock. However, the present invention presents some techniques to insure the design robustness. The following alternatives are being used in advanced microprocessor design. The present invention is a highly attractive alternative in many circumstances.

SUMMARY OF THE INVENTION

It is therefore an object of the invention to provide an arrangement of input pulse receiver circuits which is tolerant to a vary range of input pulse widths yet delivers identical output pulses.

It is another object of the invention to provide a reset generation arrangement which allow reduction of input pulse width without specification tight specification and also do not need using handshaking circuit techniques.

It is a further object of the invention to provide the interaction between forward evaluation path circuits and reset generation circuits that insures that output pulses are not necessarily shorten than input pulses for a large macro.

It is yet another object of this invention to insure proper functionality of a logic macro when the input pulse widths are wider than anticipated, without broadening the output pulse widths.

It is yet another object of this invention to provide the input isolator inside the self-resetting macro to insure the input isolation.

According to the invention, mixed static and dynamic circuits are used. The circuit comprises three stages. The input first stage is a static NOR circuit providing a pulse-chopping function. This first stage chops any too wide input pulse to the desired pulse width. The middle stage is a self-resetting complementary metal oxide semiconductor (SRCMOS) dynamic NOR circuit to capture input which is reset too soon. The last stage is a half-latch circuit to keep the dynamic node at constant output voltage level. The interfaces of all self-resetting macros in accordance with the teachings of the invention have no need for a handshake circuit or interlock circuits.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
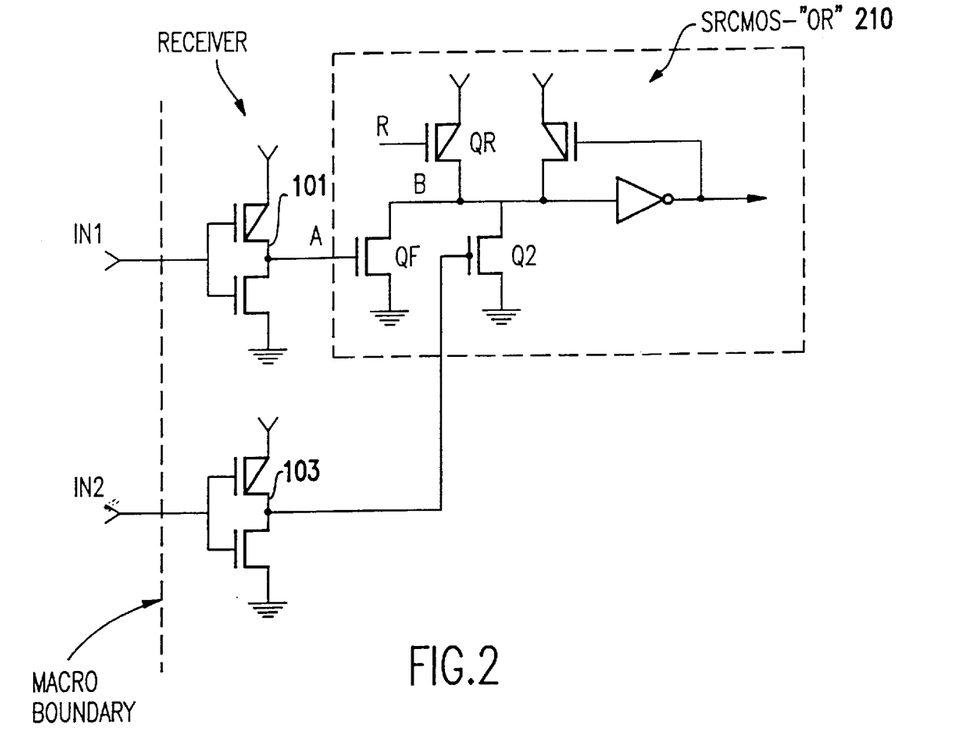
FIG. 2 is a schematic diagram of a self-resetting macro.
Figure 2A:
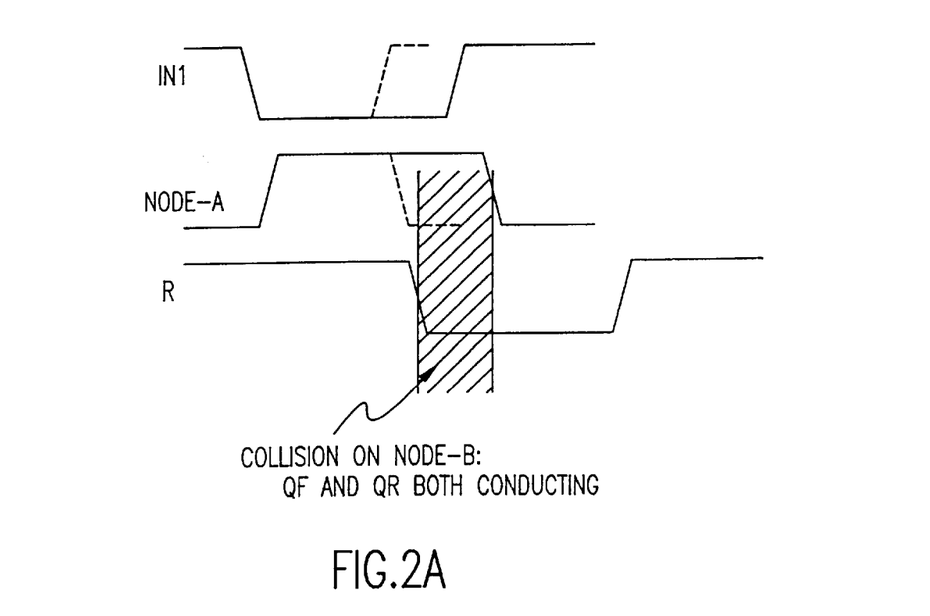
FIG. 2A is a graph illustrating an example of collision due to too wide pulse input to the self-resetting macro.

In self-resetting circuit macros, dynamic nodes are reset locally by a local timing chain. When one macro interfaces with another macro, in general the pulse width of pulses out of the sending macro must comply with an input specification of the receiving macro in order to assure proper functionality. If an input pulse is too wide, pulse "collisions" can ensue, which can cause malfunction and unnecessary power dissipation. An example of this problem is shown in FIG. 2. In this circuit, the signals from two inputs are received by inverters 101 and 103 which then serve as inputs for a self-resetting CMOS OR-circuit 210. As shown in FIG. 2A, the input pulse, IN1, generates a pulse on node A which then discharges node B. Then at the conclusion of the logic operation, the dynamic node, node B, is reset by the reset pulse, R. If input IN1 is too wide, there will be overlap of the forward-pulse, node A signal, with the reset pulse, R. In this situation both the n-channel MOS (NMOS) device, Q2, and the PMOS device, QR, are conducting, leading to some intermediate voltage level on node B and power dissipation through the QR–Q2 path this is a "collision" at node-B. In order that this circuit not malfunction, there is necessarily a "gap" between the trailing edge of the node A signal and the leading edge of the reset signal R. In order to accommodate a wide range of fabrication parameters and operating conditions this "gap" has to be wide; the wider, the better the tolerances. In a chip circuit path that encompasses many macros, this accumulation of gaps lengthens the overall path delay.

Figure 3:
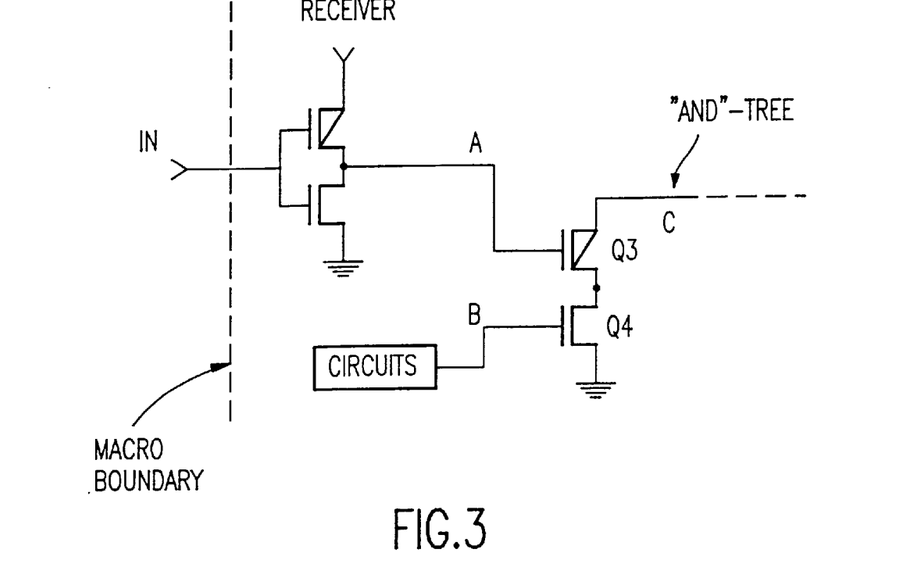
FIG. 3 is a schematic diagram of a self-resetting macro.
Figure 3A:
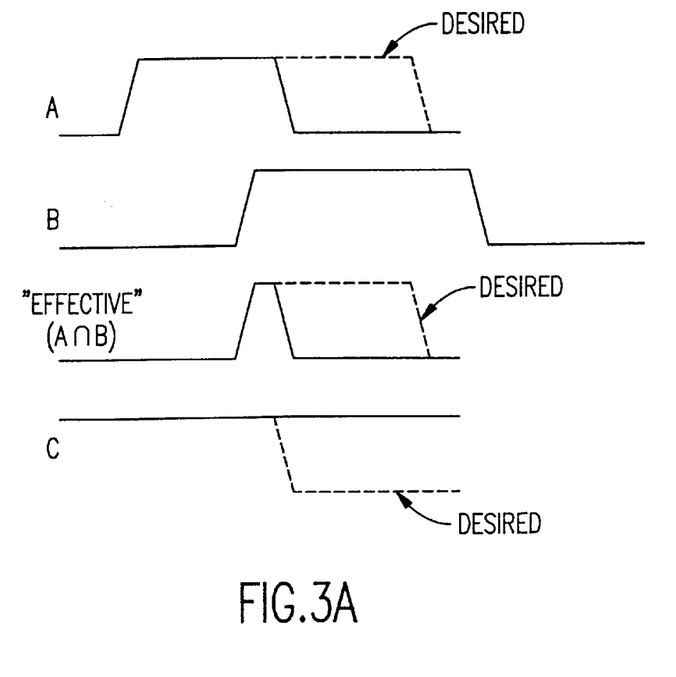
FIG. 3A is a graph illustrating an example of functional error due to too short input pulse to the self-resetting macro.

On the other hand, if the input pulses to a circuit macro are too narrow, the macro could malfunction for a different reason. The inputs may be gone before they are to be used. An example of this malfunction is shown in FIGS. 3 and 3A. In this example, the received signal produces a pulse at node A in a two-high ANDing dynamic tree, in which the bottom gate, node B, is controlled by some internal circuits. The "effective" forward-pulse input to the dynamic node C is the intersection of the node A and node B signals. If this effective signal is too narrow, the desired pull down of node C, the operation indicated by the dashed lines, will not be performed.

Dynamic logic circuits have been used to design microprocessors. Some alternatives to using the present invention are:

(1) Specifying the output and input pulse widths of every macro and keeping track of these specifications for all macros, checking for specifications for every macro to insure that every macro has adequate "gaps" for all expected operating conditions and fabrications. This is a large job and requires sacrificing path delays to insure adequate gaps.

(2) Interlocking of resetting to the leading and/or trailing edges of the input pulse. This requires extra and more complex circuitry, and is not convenient if there are many inputs having different nominal timings.

Both of the above alternatives are also being used in advanced microprocessor design. The present invention is a third alternative, highly attractive in many circumstances.

Figure 4:
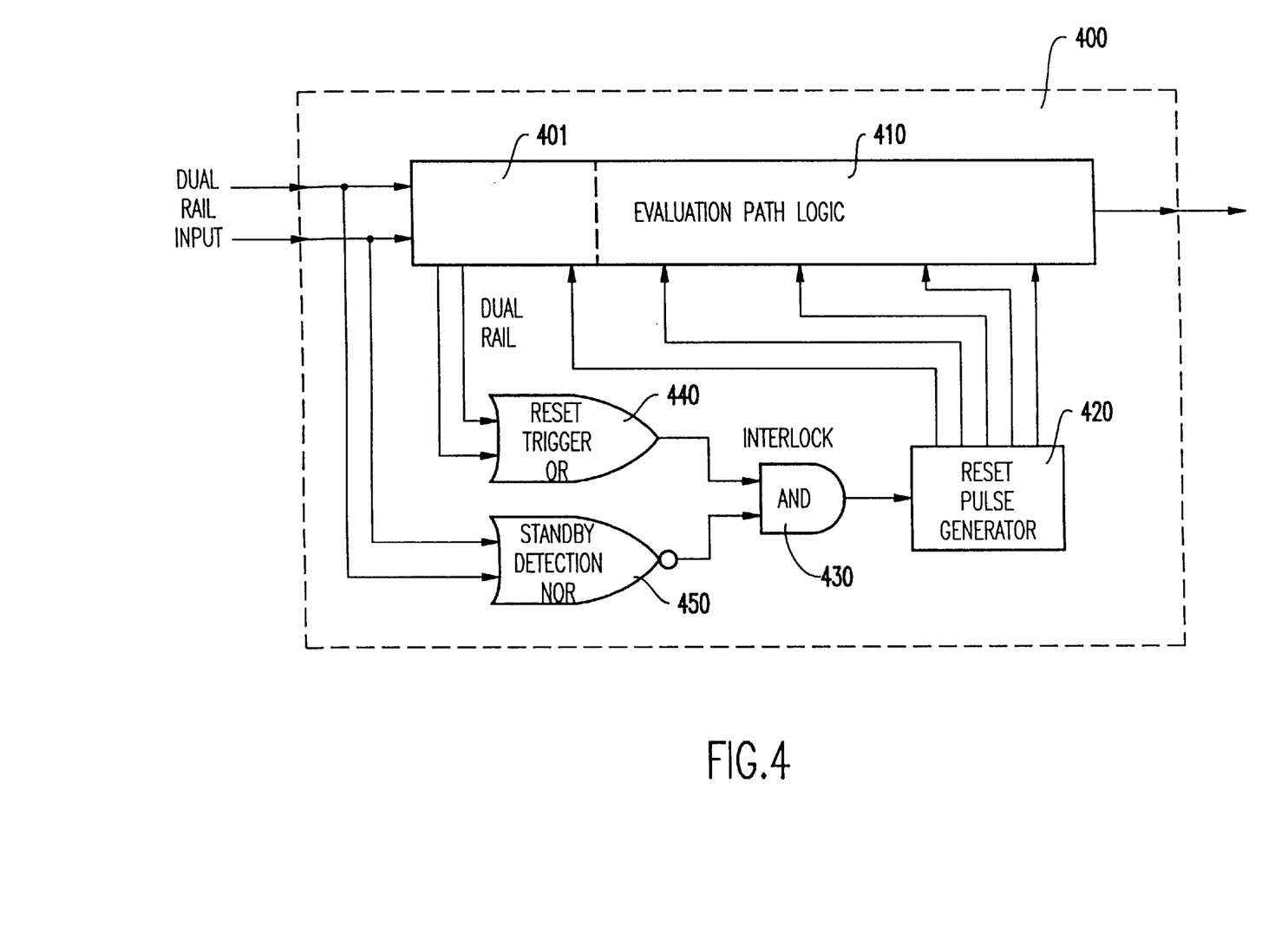
FIG. 4 is a block and logic diagram showing a self-resetting macro which includes an interlock block to promote insensitivity of output pulse width.

FIG. 4 shows an embodiment self-resetting macro 400 using input interlock technique. It consists of an upper part, forward evaluation path logic block 410, and a lower part, reset pulse generator 420 and timing control circuits. The block 410 receives the dual rail logic input. The objective of the reset pulse generator 420 is to generate several independent reset pulses, in response to the input trigger by the macro's forward-path. The reset pulses are used for resetting the dynamic nodes contained within the macro's forward-path logic. The reset pulses must be timed so as not to be in contention with the forward-path pulses. This resetting is done without resorting to a global clock; i.e., the macro logic 400 resets itself.

The basic elements of the timing control circuits in FIG. 4 are a reset trigger-OR circuit 440, a standby detection NOR circuit 450, and an input-interlock 2-way AND circuit 430. The reset timing chain generator 420 is triggered by the interlock circuit 430. The reset trigger OR circuit 440 receives dual rail trigger signals from the front end 401 of the evaluation path logic 410 and detects when one of the standby-low input rails of the strobe activates, indicating triggering the path. The standby detection NOR circuit 450 receives the dual rail input and generates an output to the interlock AND circuit 430.

For this macro scheme 400, the front-end circuits 401 should not be reset before the inputs have reset in order to prevent contention and to insure proper functionality. This is insured by the input interlock AND 430, which prevents triggering the reset pulses until the dual-rail inputs have returned to their standby states.

Figure 5:
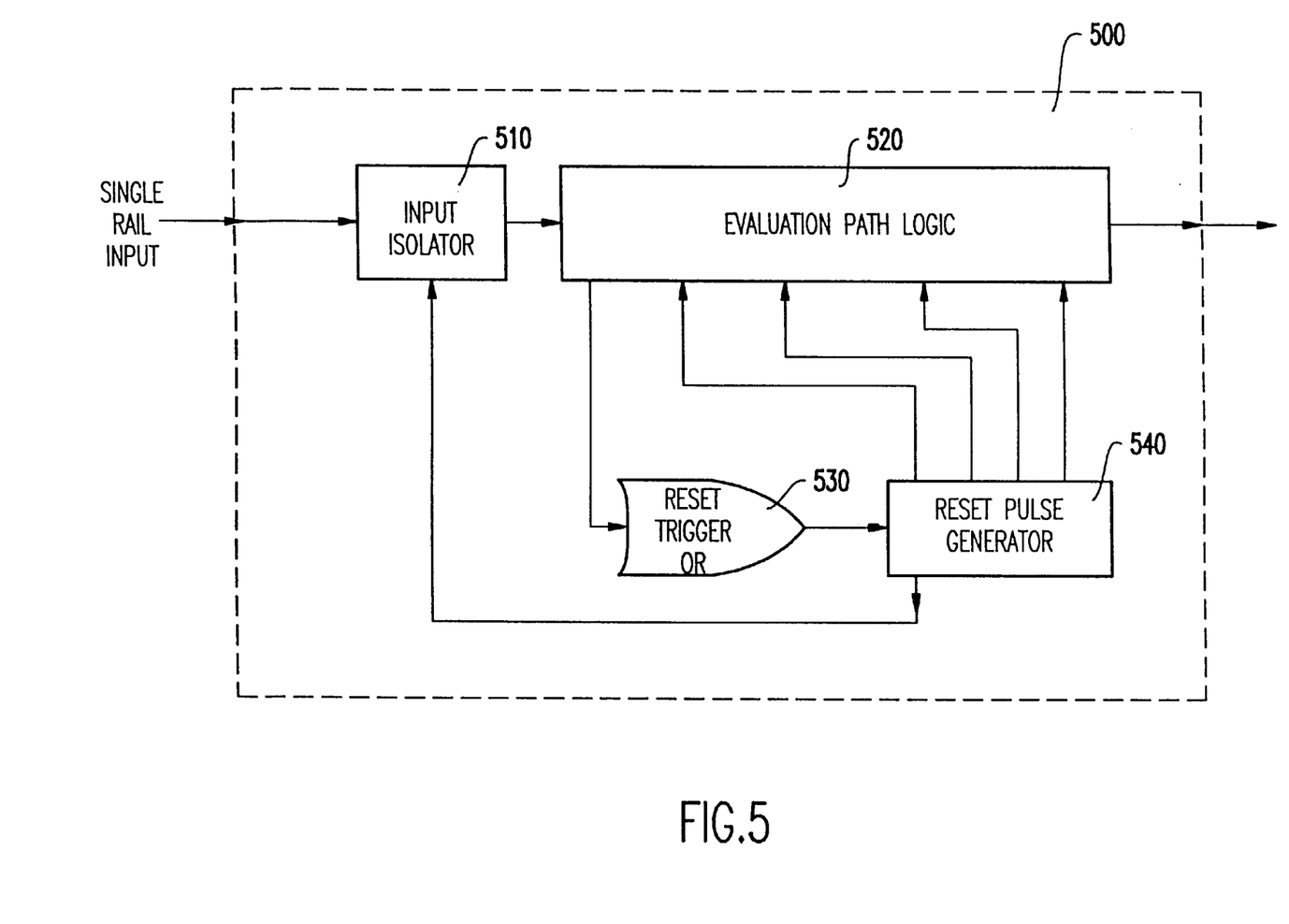
FIG. 5 is a block and logic diagram showing a self-resetting macro which includes an input isolator to promote insensitivity of output pulse width.

FIG. 5 shows another embodiment of the invention comprising a self-resetting macro 500 using an input isolator technique. This embodiment comprises an upper part, the input isolator 510 and forward evaluation path logic block 520, and a lower part, the reset trigger circuit 530 and reset pulse generator 540. In this case, single-rail dynamic inputs are employed for the forward evaluation path. A new input isolation scheme is used, wherein an input pulse is caught, and then the input isolated. There is no input logic interlock. The detailed descriptions of the input isolation technique are presented as follows.

The present invention is a circuit which desensitizes a self-resetting, or self-timed macro to the pulse width of an input signal, without penalizing path performance significantly. As such, employment of the circuit effectively decouples the design of interfacing macros, making an individual macro's design much more independent and flexible. The circuit can be made very fast, and is compatible with fast self-resetting CMOS and other dynamic circuits.

Figure 6:
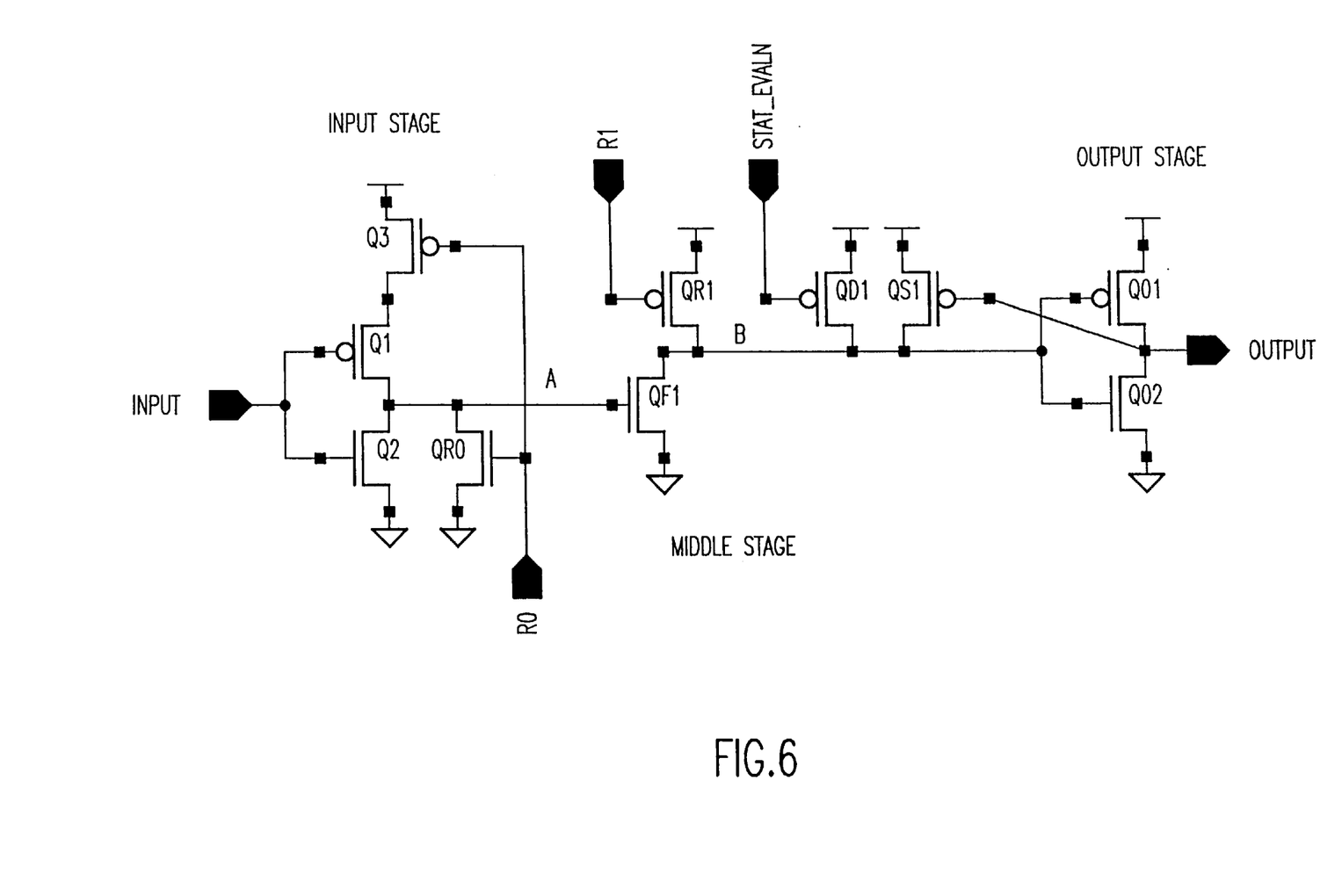
FIG. 6 is a schematic circuit diagram of a preferred form of the invention.

The circuit is shown in FIG. 6, which performs both an isolation function and an amplification function. The input stage is a static-NOR circuit, with the input standby state being high, and the standby state of the "R0" signal being low. The middle stage is a one-input dynamic-NOR circuit which is reset by the "R1" signal, and the last stage is an output half-latch. The half-latch with feedback to a small standby device controls noise and holds the dynamic node high during standby. The signals "R0" and "R1" are generated sequentially (R0 first, the R1 second) from a timing chain (generated from FIG. 5) triggered somewhere along the forward path of the macro. R0 is active high whereas R1 is active low. The first stage performs a pulse-chopping function on any input pulse which is too wide, whereas the middle stage serves to capture an input which is resets too soon.

Specifically referring to FIG. 6, the R0 signal resets node A independently of the input resetting. This insures that there is no collision on node B which does not reset until R1 is active. Hence, the output pulse width is not affected by the early resetting of the input. Thus, the circuit in FIG. 6 provides an output pulse which is highly insensitive to the pulse width of the input pulse.

Figure 7:
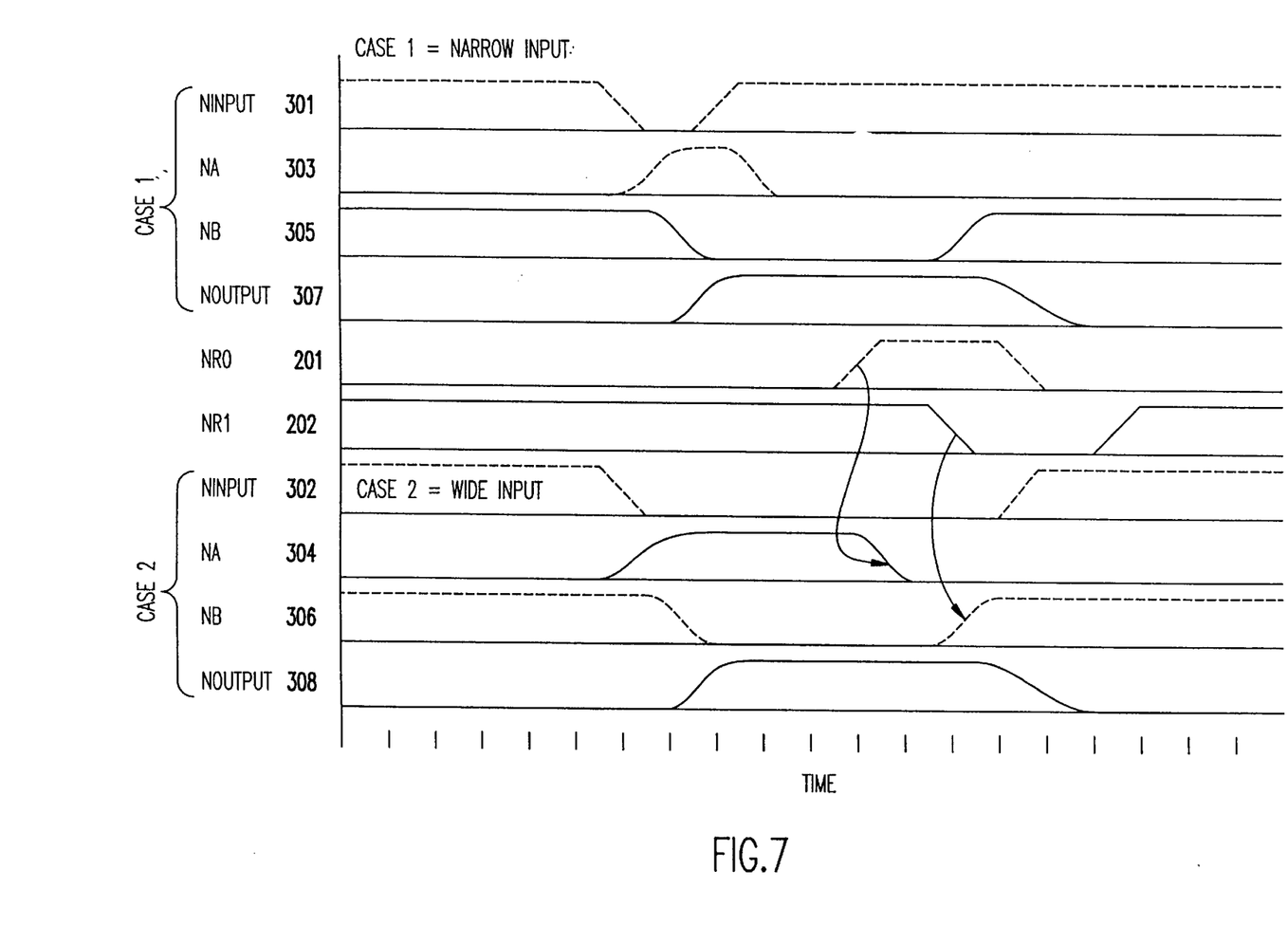
FIG. 7 is a graph showing a simulation timing diagram of the input isolator demonstrating identical outputs for narrow or wide inputs.

Simulation of the circuit shown in FIG. 6 for a 1 pico Farad (pf) capacitive load are shown in FIG. 7. The upper waveforms show a case 1 in which the input pulse width 301 is narrow, 300 pico seconds (ps). Node A and node B corresponding waveforms are represented as NA 303 and NB 305 waveforms, respectively. The output waveform is represented as NOUTPUT 307 waveforms. Similarly, a case 2 in which the input pulse width 302 is wide, 1400 ps, node A and node B corresponding waveforms are represented by NA 304 and NB 306 waveforms, respectively. The output waveform is represented as NOUTPUT 308 waveform. The reset signals, R0 201 and R1 202 pulses are the same for both cases. It can be seen that the output pulses 307 and 308 are identical, and there are no pulse collisions for this wide input variation. In the circuit of FIG. 6, the inclusion of the static-evaluation device QD1 is optional. Signals R0 and R1 are pulses generated from other circuits within the receiving macro, which was described in FIG. 5. In this implementation, at standby, R0 is low, R1 is high, the input is high, node A is low, node B is high, and the output is low.

Figure 8:
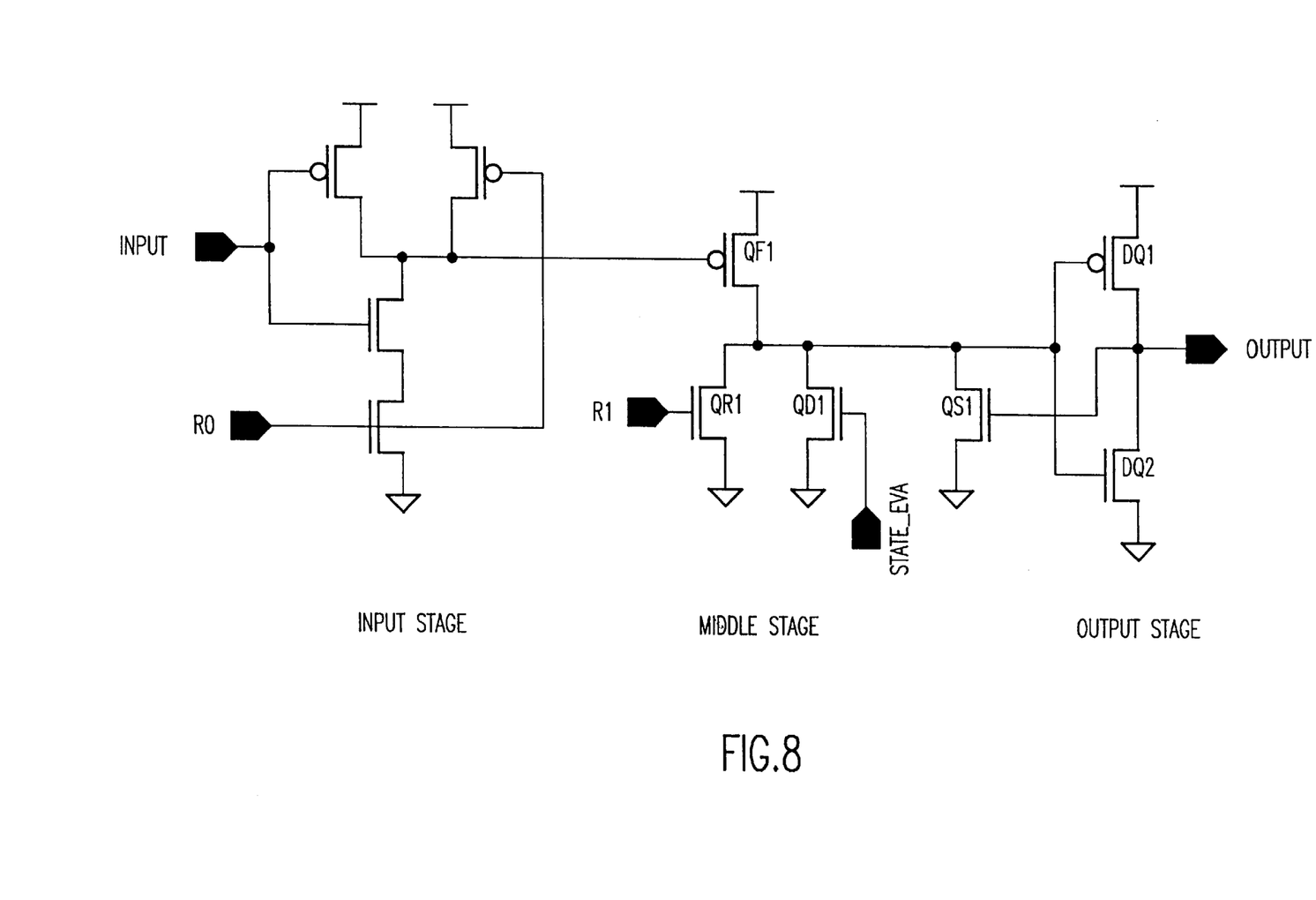
FIG. 8 is schematic circuit diagram of another preferred embodiment of the invention.

Another preferred embodiment of the invention is shown in FIG. 8 and comprises a static-NAND input stage. The middle stage comprises devices QF1, QR0, R0, R1 and QS1, all being of opposite polarity to circuit of FIG. 6. Also the two input signals to the static NAND circuit, the input stage, are of opposite polarity to those in the FIG. 6 embodiment. The standby state for the input signal is low, and the standby state for the signal R0 is high.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A self-resetting CMOS input isolator for self-resetting CMOS macros comprising:
   an input static stage which performs a pulse-chopping function on any input pulse which is too wide;
   a middle dynamic stage connected to receive an output from the input static stage and providing an output to a dynamic node, the middle dynamic stage serving to capture an input which is reset too soon; and
   an output latching stage connected to receive an output from the middle dynamic stage and controlling noise and holding the dynamic node high during standby.

2. The self-resetting CMOS input isolator for self-resetting CMOS macros as recited in claim 1 wherein the input stage of the isolator is a static NOR circuit.

3. The self-resetting CMOS input isolator for self-resetting CMOS macros recited in claim 2 wherein the middle stage of the isolator is a dynamic one way-NOR circuit.

4. The self-resetting CMOS input isolator for self-resetting CMOS macros recited in claim 3 wherein the output stage is an output half-latch.

5. The self-resetting CMOS input isolator for self-resetting CMOS macros recited in claim 4 further comprising a small standby device receiving feedback from the half-latch.

6. The self-resetting CMOS input isolator for self-resetting CMOS macros as recited in claim 1 wherein the input stage of the isolator is a static NAND circuit.

7. The self-resetting CMOS input isolator for self-resetting CMOS macros recited in claim 6 wherein the output stage is an output half-latch.

8. The self-resetting CMOS input isolator for self-resetting CMOS macros recited in claim 7 further comprising a small standby device receiving feedback from the half-latch.

9. A self-resetting macro, comprising:
   an input isolator;
   a forward evaluation path logic which is electrically coupled to said input isolator;
   a reset trigger circuit which is electrically coupled to said foreward evaluation path logic; and
   a reset pulse generator which is electrically coupled to said forward evaluation path logic, said input isolator, and said reset trigger circuit.

10. The self-resetting macro recited in claim 9 wherein said input isolator comprises:
    an input static stage which performs a pulse-chopping function on any input pulse which is too wide;
    a middle dynamic stage connected to receive an output from the input static stage and providing an output to a dynamic node, the middle dynamic stage serving to capture an input which is reset too soon; and
    an output latching stage connected to receive an output from the middle dynamic stage and controlling noise and holding the dynamic node high during standby.

11. The self-resetting macro recited in claim 10 wherein the input stage of the isolator is a static NOR circuit.

12. The self-resetting macro recited in claim 11 wherein the middle stage of the isolator is a dynamic one way-NOR circuit.

13. The self-resetting macro recited in claim 12 wherein the output stage is an output half-latch.

14. The self-resetting macro recited in claim 13 further comprising a small standby device receiving feedback from the half-latch.

15. The self-resetting macro recited in claim 10 wherein the input stage of the isolator is a static NAND circuit.

16. The self-resetting macro recited in claim 15 wherein the output stage is an output half-latch.

17. The self-resetting macro recited in claim 16 further comprising a small standby device receiving feedback from the half-latch.

18. A self-resetting macro, comprising:

a forward evaluation path logic receiving a dual rail logic input and generating an output;

a standby detection circuit receiving the dual rail logic input and generating a logic output;

a reset trigger circuit responsive to dual rail trigger signals from a front end of the forward evaluation path logic and detecting when one of the input dual rails activates;

an interlock circuit responsive to the standby detection circuit and the reset trigger circuit; and a reset timing chain generator triggered by the interlock circuit generating reset pulses for resetting dynamic nodes contained within the forward evaluation path logic, the reset pulse being timed to avoid contention with forward-path pulses of the forward evaluation path logic.

19. The self-resetting macro recited in claim 18 wherein the standby detection circuit is a NOR circuit, the reset trigger circuit is an OR circuit, and the interlock circuit is an AND circuit.

* * * * *